United States Patent
Gomez et al.

(10) Patent No.: US 9,114,413 B1
(45) Date of Patent: Aug. 25, 2015

(54) MULTIPLEXED ELECTROSPRAY COOLING

(76) Inventors: Alessandro Gomez, Orange, CT (US); Weiwei Deng, Orlando, FL (US)

( * ) Notice: Subject to any disclaimer, the term of this patent is extended or adjusted under 35 U.S.C. 154(b) by 1233 days.

(21) Appl. No.: 12/817,529

(22) Filed: Jun. 17, 2010

Related U.S. Application Data (60) Provisional application No. 61/187,751, filed on Jun. 17, 2009.

(51) Int. Cl.
| | |
|---|---|
| A01G 23/10 | (2006.01) |
| B05B 1/24 | (2006.01) |
| B05B 1/14 | (2006.01) |
| B05B 5/00 | (2006.01) |
| B05B 5/053 | (2006.01) |
| B05B 5/03 | (2006.01) |

(52) U.S. Cl.
CPC ........ *B05B 5/0533* (2013.01); *B05B 5/03* (2013.01)

(58) Field of Classification Search
CPC ........ B05B 5/0533; B05B 5/00; B05B 5/005; B05B 5/001; B05B 5/006; B05B 5/007; B05B 5/008; B05B 5/025; B05B 5/0255; B05B 5/035; B05B 5/053; B05B 5/03
USPC ............ 239/3, 690–708, 556–558, 13; 431/2, 431/18, 258; 427/458–486
See application file for complete search history.

(56) References Cited

U.S. PATENT DOCUMENTS

| | | | | |
|---|---|---|---|---|
| 3,941,312 A | * | 3/1976 | Ohno et al. | 239/696 |
| 4,381,533 A | * | 4/1983 | Coffee | 361/228 |
| 4,748,043 A | * | 5/1988 | Seaver et al. | 427/482 |
| 4,749,125 A | * | 6/1988 | Escallon et al. | 239/3 |
| 4,788,016 A | * | 11/1988 | Colclough et al. | 264/10 |
| 4,801,086 A | * | 1/1989 | Noakes | 239/3 |
| 4,846,407 A | * | 7/1989 | Coffee et al. | 239/690 |
| 5,044,564 A | * | 9/1991 | Sickles | 239/690.1 |
| 5,052,617 A | * | 10/1991 | Colclough et al. | 239/4 |
| 5,332,154 A | * | 7/1994 | Maier et al. | 239/3 |
| 5,503,335 A | * | 4/1996 | Noakes et al. | 239/690 |
| 6,708,908 B2 | * | 3/2004 | Heldt et al. | 239/700 |
| 6,755,024 B1 | * | 6/2004 | Mao et al. | 60/776 |
| 7,455,250 B2 | * | 11/2008 | Muljono | 239/696 |
| 7,872,848 B2 | * | 1/2011 | Song | 361/226 |
| 7,951,428 B2 | * | 5/2011 | Hoerr et al. | 427/483 |
| 8,028,646 B2 | * | 10/2011 | Pui et al. | 118/50.1 |
| 2002/0003177 A1 | * | 1/2002 | O'Connor et al. | 239/696 |
| 2010/0077792 A1 | * | 4/2010 | Gurin | 62/470 |
| 2010/0155496 A1 | * | 6/2010 | Stark et al. | 239/3 |

* cited by examiner

*Primary Examiner* — Len Tran
*Assistant Examiner* — Steven M Cernoch
(74) *Attorney, Agent, or Firm* — Carmody Torrance Sandak & Hennessey LLP (57) ABSTRACT

The present invention is directed to a multiplexed system for electrospraying cooling fluid to produce electrically charged droplets essentially uniform in size for cooling applications. The system comprise a preferably microfabricated fluid distributor consisting of multiple nozzles/atomizers from which the droplets are dispersed, an extractor electrode consisting in an electrically conductive plate with multiple holes coaxial with the nozzles and a third electrode consisting of either the surface to be cooled or another conductive material in contact with said surface. The system provides highly efficient cooling by avoiding the droplet rebound, when the charged droplets are pinned on the surface to be cooled by the electric image force. Testing of a prototype system demonstrated a heat flux removal of 96 W/cm$^2$ with a remarkable cooling efficiency reaching 97%. Applications of the invention pertain to the effective removal of high heat flux from microelectronic chips or similar devices with cooling requirements.

11 Claims, 7 Drawing Sheets

MULTIPLEXED ELECTROSPRAY COOLING

CROSS REFERENCE TO RELATED APPLICATIONS

This application claims the benefit of U.S. Provisional Application No. 61/187,751, filed on Jun. 17, 2009, the subject matter of which is herein incorporated by reference in its entirety.

STATEMENT REGARDING FEDERALLY SPONSORED RESEARCH OR DEVELOPMENT

This invention was partially made with U.S. Government support from U.S. Army (W911NF-05-2-0015). Accordingly, the U.S. Government may have certain rights in this invention.

BACKGROUND OF THE INVENTION

Electrostatic means for liquid dispersion in minute droplets are used in a variety of technological applications, such as paint spraying, ionization for chemical analysis, drug inhalation, synthesis of particles from liquid precursors, and surface coating, by way of example and not limitation. The class of atomizers in which the dispersion of the liquid is driven exclusively by electric forces is referred to heretofore as electrospray (ES). Within this class of atomizers it is often desirable to tightly control the size distribution of the resulting aerosol. Such a system can be implemented by feeding a liquid with sufficient electric conductivity through a small opening, such as the tip of a capillary tube or a suitably treated "hole", maintained at several kilovolts relative to a ground electrode positioned a few centimeters away. The liquid meniscus at the outlet of the capillary takes a conical shape under the action of the electric field, with a thin jet emerging from the cone tip. This jet breaks up farther downstream into a spray of fine, charged droplets. In view of the morphology of the liquid meniscus, this regime is labeled as the cone-jet mode.

Among the key features that distinguish the cone jet electrospray from other atomization techniques are: quasi-monodispersity of the droplets; Coulombic repulsion of the charged droplets, which induces spray self-dispersion, prevents droplet coalescence and enhances mixing with the oxidizer; and the use of a spray "nozzle" with a relatively large bore with respect to the size of the generated droplets, which implies that liquid line obstruction risks are minimized. The cone-jet mode can produce droplets/particles over a wide size range, from submicron to hundreds of micrometers, depending on liquid flow rate, applied voltage and liquid electric conductivity.

Within the cooling context advancements of integrated circuits have been recently hampered by the severe challenge of the removal of high heat flux. Effective chip cooling may become the bottleneck of further progress in the microelectronic industry. Compared to conventional fan cooling that often rely on a thermal spreader, cooling by direct liquid impingement on the chip back side is promising for high heat flux removal, because it eliminates the contact thermal resistance, promotes high velocity gradients that favour heat dissipation, and exploits the liquid latent heat when phase changes occur. The coolant can take the form of impinging jets or sprays. Micro jets array generated by silicon microfabricated nozzles with open or closed drainage are examples of jet cooling. Spray cooling, currently used in some supercomputers such as the CRAY X-1, in principle is more effective than jet impingement cooling, mainly because the liquid film formed by sprays is typically much thinner (by a factor of ten) than that of liquid jets.

The physical process of spray cooling results from the impact of droplets on a heated surface, which, in turn, may lead to splash, spread, or rebound. If the surface temperature is higher than the Leidenfrost point of the liquid, the droplet tends to rebound because the pressure of the vapour below the liquid partially lifts the droplet. As a result, in conventional sprays only a fraction of the liquid cooling capacity is exploited because of this rebound loss. A possible approach to reduce or even entirely eliminate this loss is to electrically charge the droplets with respect to the hot conducting surface and rely on Coulombic attraction, if charge leakage on contact is sufficiently slow. In this context, ES is potentially well suited for cooling purposes because of its unique properties described earlier, especially the small and uniform droplet size and reasonably even number density throughout the spray. The ES-generated droplets are small and quasi-monodisperse, with reasonably uniform number density throughout the spray. The inner diameter of the ES nozzle is typically 10-100× larger than the droplet, which reduces the risk of clogging and dramatically decreases the liquid pressure drop, from ~$10^5$ Pa of a conventional atomizer to ~$10^3$ Pa of ES systems.

ES has been widely used in ionization mass spectroscopy. In virtually all other applications, it has been plagued by one critical drawback: the low flow rate of a single ES source, which would make it inadequate even for spray cooling. This drawback has been recently overcome by microfabricated multiplexed ES (MES) systems, which allow for the dispersion of large flow rates through multiple, densely packed ES sources operating in parallel. Furthermore, the "digital" version of the MES devices, in which each individual spray can be turned on/off selectively via electronic control, has also the potential for precise local thermal management of hot spots on microelectronic chips.

It is an object of this invention to provide an improved electrospray apparatus and method which enables production of electrically charged droplets of highly uniform size from multiplexed electrosprays for the cooling of microelectronic chips or other surfaces requiring precise control of the thermal load. As a proof of concept, a miniaturized MES device was demonstrated to remove a heat flux of 96 W/cm², with the potential of additional scale up, and with an unprecedented cooling efficiency reaching up to 97%.

SUMMARY OF THE INVENTION

The present invention is directed to a multiplexed apparatus for electrospraying an electrosprayable fluid to produce electrically charged droplets essentially uniform in size for cooling applications. In a preferred embodiment, the present invention is directed to a multiplex apparatus for cooling, said apparatus comprising:

a) an array of several substantially uniform atomizers or nozzles for electrospraying an electrosprayable cooling fluid to produce droplets of essentially uniform size from monodispersed cone jet electrosprays in the presence of an electric field;

b) at least one electrode spaced from the outlet of the atomizer array; wherein the electric field is between the outlets of the atomizers and the at least one electrode; and wherein each atomizer produces at least one cone jet of fluid at its outlet when the electric field is present; and wherein the at least one cone-jet produces droplets of such a size that rebound from a preferably grounded electrode is prevented as a result of electric image force;

c) an additional electrode, preferably grounded, either comprising a surface to be cooled or in thermal contact with said surface to ensure optimal heat transfer with the electrically charged droplets of the cooling fluid produced by the cone jet electrosprays when they impinge on the additional electrode;

wherein the electric field between the extractor electrode and the additional electrode favors the impingement of the charged droplets on the grounded electrode;

d) a source of cooling fluid operably connected to the array of substantially uniform nozzles for providing the fluid to be electrosprayed; and e) means for introducing and maintaining a desired voltage drop between the array of substantially uniform nozzles and the extractor electrode and between the extractor electrode and the ground electrode.

In another embodiment, the present invention is directed to a microfabricated multiplex electrospray apparatus for cooling, said apparatus comprising:

a) a microfabricated array of substantially uniform nozzles wherein the outlet of each nozzle of the array of nozzles is substantially cylindrical for electrospraying an electrosprayable cooling fluid to produce droplets of essentially uniform size from monodispersed cone-jet electrosprays in the presence of an electric field;

b) one extractor electrode spaced from the outlet of the atomizer array comprising of an electrically conducting plate with multiple holes coaxial with the nozzles; wherein the electric field is between the outlets of the nozzles and the extractor electrode; and wherein each nozzle produces at least one cone jet of fluid at its outlet when the electric field is present; and wherein the at least one cone-jet produces droplets of such a size that rebound from a preferably grounded electrode is prevented as a result of electric image force; and c) at least one insulating spacer arranged between the array of substantially uniform nozzles and the extractor electrode array to position the extractor electrode at the desired distance from the top of the array of substantially uniform nozzles;

d) an additional electrode, preferably grounded, either comprising a surface to be cooled or in thermal contact with said surface to ensure optimal heat transfer with the electrically charged droplets of the cooling fluid produced by the cone jet electrosprays when they impinge on the additional electrode;

wherein the electric field between the extractor electrode and the grounded electrode favors the impingement of the charged droplets on the grounded electrode;

e) a source of fluid operably connected to the array of substantially uniform nozzles for providing the fluid to be electrosprayed; and f) electrical means for maintaining a desired voltage drop between the array of substantially uniform nozzles and the extractor electrode and between the extractor electrode and the ground electrode.

The present invention is also directed to a method of multiplexing an electrosprayable fluid from the outlets of an array of substantially uniform atomizers or nozzles to produce electrically charged droplets of essentially uniform size from cone-jets, wherein each atomizer is capable of producing at least one cone-jet of fluid at the outlet when an electric field is present, the method comprising the steps of:

a) introducing and maintaining an electric field between atomizer array and an extractor electrode enabling the establishment of cone-jet electrosprays at the atomizer outlets;

b) atomizing the electrosprayable fluid in the atomizer array to partition the fluid into multiple monodispersed cone-jet electrosprays that anchor to the outlet of each atomizer in the array; and c) introducing and maintaining an electric field between the extractor electrode and a third electrode at lower electric potential or grounded to favor the impingement of the charged droplets on the grounded electrode for cooling purposes;

d) introducing means to enhance the thermal contact between the third electrode and the surface to be cooled;

e) using electrosprayable fluid comprises a liquid of finite electric conductivity with desirable cooling features including water, aqueous solutions, liquid hydrocarbons, alcohols, fluorocarbon liquids (e.g. FC-72, FC-86, FC-77, etc.) and other coolants, and combinations of one or more of the foregoing, wherein the electrosprayable fluid further comprises an electrical conductivity enhancer such as an ionic liquid; and f) uniformly partitioning the fluid flow rate among the multiple monodispersed cone jet electrosprays.

The invention provides highly efficient cooling. Testing of a prototype system demonstrated a heat flux removal of 96 W/cm$^2$ with a remarkable cooling efficiency reaching 97%. Scale-up considerations suggest that the electrospray approach is well suited for practical applications by increasing the level of multiplexing and by preserving the system compactness using microfabrication. Applications of the invention pertain to the effective removal of high heat flux from microelectronic chips or similar devices plagued by intense cooling requirements.

BRIEF DESCRIPTION OF THE FIGURES

For a fuller understanding of the invention, reference is made to the following description taken in connection with the accompanying figures, in which:

FIG. 1 (a) depicts a schematic of the MES device showing key components including liquid reservoir, silicon nozzle chip, the extractor electrode and ground electrode. (b) shows a scanning electron micrographs (SEM) of a 19-nozzle microfabricated array. (c) shows a picture of the sprays from a 91-nozzle MES system with packing density of 253 sources/cm$^2$. (d) shows a picture of the sprays from a 19-nozzle system with packing density of 11,000 sources/cm$^2$.

FIG. 2 depicts the setup for cooling application, with the components in FIGS. 1*a* and *b*, clearly identified, including the resistance temperature detector elements, that is grounded and is used as both temperature sensor and heater to mimic the Joule heating of a microelectronic chip or other devices requiring well-controlled thermal load, and the flow visualization apparatus.

FIG. 3 shows a high-speed photograph sequence of the droplet impact showing a) no rebound for a picoliter droplet and b) immediate rebound for a nanoliter droplet. Substrate temperature is 120° C.; camera speed is 125,000 frames/s. Droplet diameter and impact velocity are reported in the first column.

FIG. 4 depicts a graph with typical MES cooling curves using ethanol at a flow rate of 100 cc/h.

FIG. 5 depicts a graph with droplet size as a function of flow rate for liquids with different electric conductivity and, consequently, droplet size for a given flow rate.

FIG. 6 depicts a graph with cooling curves showing heat extracted per unit area and time (heat flux) as a function of wall temperature for liquids with different electric conductivity operated at a flow rate of 25 cc/h at two different droplet sizes.

DETAILED DESCRIPTION OF THE PREFERRED EMBODIMENTS

The present invention is directed to a multiplexed apparatus for electrospraying an electrosprayable fluid to produce electrically charged droplets essentially uniform in size for cooling applications. In a preferred embodiment, the present invention is directed to a multiplex apparatus for cooling, said apparatus comprising:

a) an array of several substantially uniform atomizers or nozzles for electrospraying an electrosprayable cooling fluid to produce droplets of essentially uniform size from monodispersed cone jet electrosprays in the presence of an electric field;

b) at least one electrode spaced from the outlet of the atomizer array; wherein the electric field is between the outlets of the atomizers and the at least one electrode; and wherein each atomizer produces at least one cone-jet of fluid at its outlet when the electric field is present; and wherein the at least one cone-jet produces droplets of such a size that rebound from a preferably grounded electrode is prevented as a result of electric image force;

c) an additional electrode, preferably grounded, either comprising a surface to be cooled or in thermal contact with said surface to ensure optimal heat transfer with the electrically charged droplets of the cooling fluid produced by the cone jet electrosprays when they impinge on the additional electrode; wherein the electric field between the extractor electrode and the additional electrode favors the impingement of the charged droplets on the grounded electrode;

d) a source of cooling fluid operably connected to the array of substantially uniform nozzles for providing the fluid to be electrosprayed; and e) means for introducing and maintaining a desired voltage drop between the array of substantially uniform nozzles and the extractor electrode and between the extractor electrode and the ground electrode.

In another embodiment, the present invention is directed to a microfabricated multiplex electrospray apparatus for cooling, said apparatus comprising:

a) a microfabricated array of substantially uniform nozzles wherein the outlet of each nozzle of the array of nozzles is substantially cylindrical for electrospraying an electrosprayable cooling fluid to produce droplets of essentially uniform size from monodispersed cone-jet electrosprays in the presence of an electric field;

b) one extractor electrode spaced from the outlet of the atomizer array comprising of an electrically conducting plate with multiple holes coaxial with the nozzles; wherein the electric field is between the outlets of the nozzles and the extractor electrode; and wherein each nozzle produces at least one cone jet of fluid at its outlet when the electric field is present; and wherein the at least one cone-jet produces droplets of such a size that rebound from a preferably grounded electrode is prevented as a result of electric image force; and c) at least one insulating spacer arranged between the array of substantially uniform nozzles and the extractor electrode array to position the extractor electrode at the desired distance from the top of the array of substantially uniform nozzles;

d) an additional electrode, preferably grounded, either comprising a surface to be cooled or in thermal contact with said surface to ensure optimal heat transfer with the electrically charged droplets of the cooling fluid produced by the cone jet electrosprays when they impinge on the additional electrode; wherein the electric field between the extractor electrode and the grounded electrode favors the impingement of the charged droplets on the grounded electrode;

e) a source of fluid operably connected to the array of substantially uniform nozzles for providing the fluid to be electrosprayed; and f) electrical means for maintaining a desired voltage drop between the array of substantially uniform nozzles and the extractor electrode and between the extractor electrode and the ground electrode.

In one embodiment of the invention, the outlet of the atomizer is substantially cylindrical. However, it is not required that the outlet be substantially cylindrical and other outlet shapes may also be used so long as it is possible to intensify the electric field at the outlet.

The electrical field is typically established between the outlet of the atomizer and the extractor electrode by charging and holding the electrode to a substantially different voltage from that of the atomizer, and between the ring extractor and the grounded electrode by charging and holding the extractor electrode to a substantially different voltage from ground.

The system of the invention also typically comprises means for introducing and maintaining an electric field between the atomizer and the extractor electrode, and between the extractor electrode and the ground electrode.

The system of the invention comprises means to uniformly partition the fluid flow rate among the multiple nozzles to establish substantially uniform monodispersed cone jet electrosprays.

The electrosprayable fluid must have finite electric conductivity with desirable cooling features including water, aqueous solutions, liquid hydrocarbons, alcohols, fluorocarbon liquids (e.g. FC-72, FC-86, FC-77, etc.) and other coolants, and combinations of one or more of the foregoing, wherein the electrosprayable fluid further comprises an electrical conductivity enhancer such as an ionic liquid; and The present invention may be further described by reference to the experimental system described below and the subsequent non-limiting examples.

Experimental System

Figure 1:
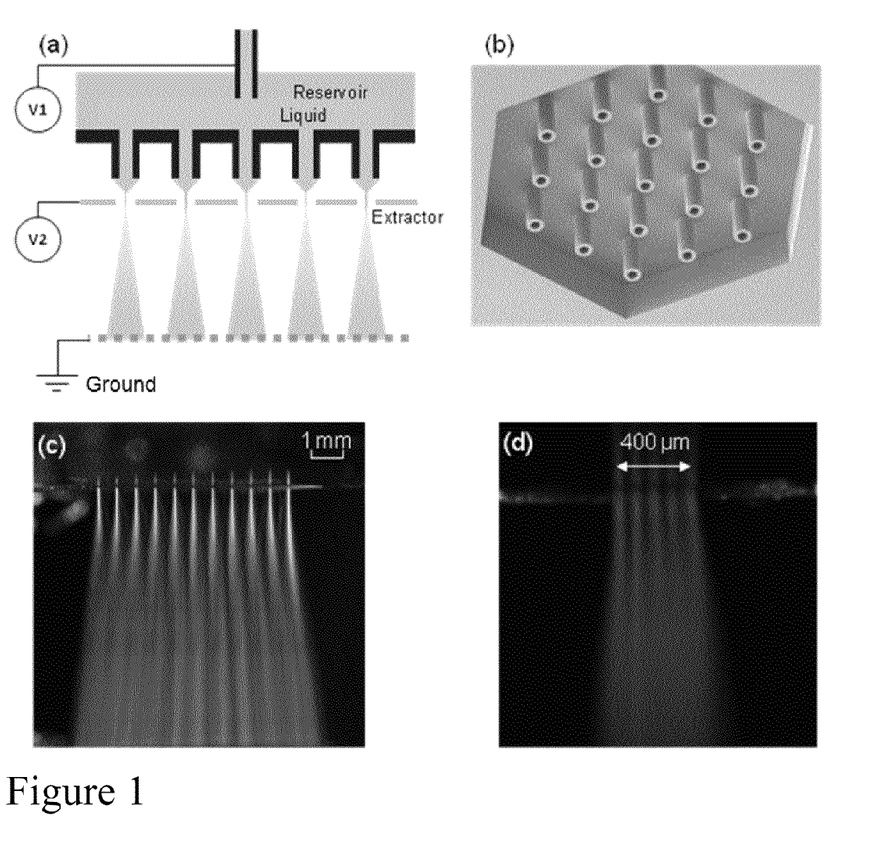
Figure 2:
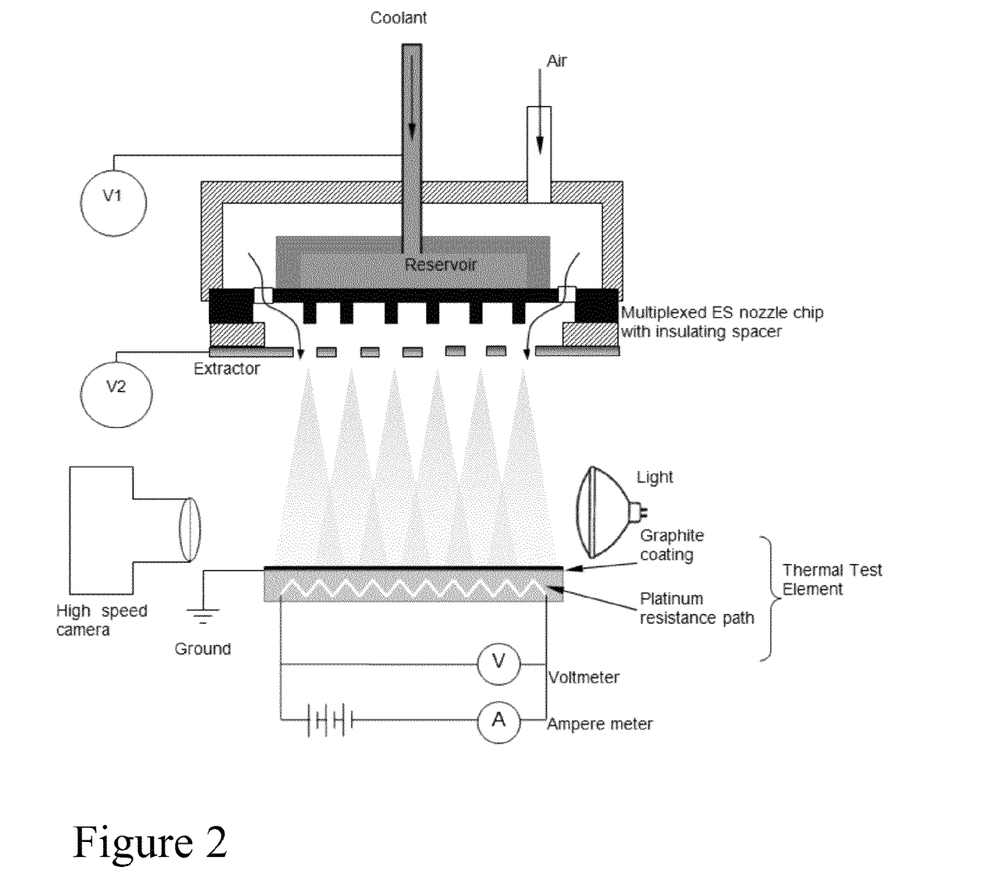
Figure 3:
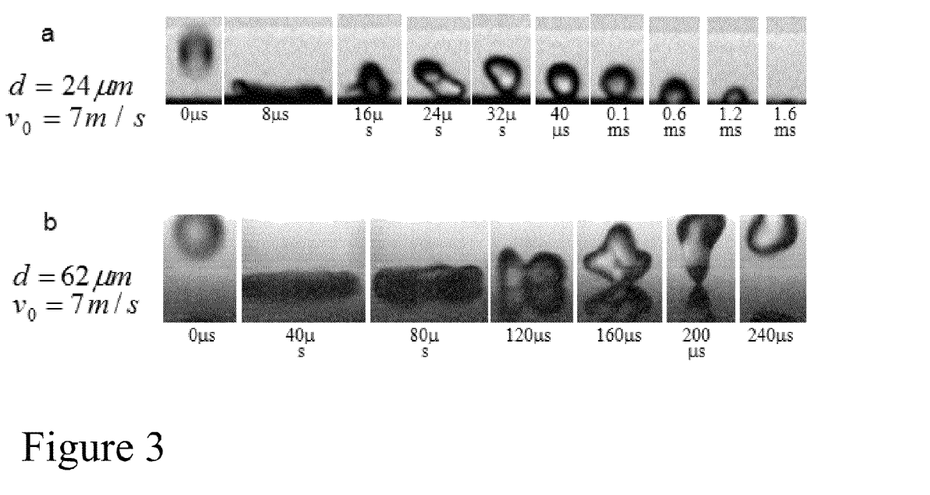
Figure 5:
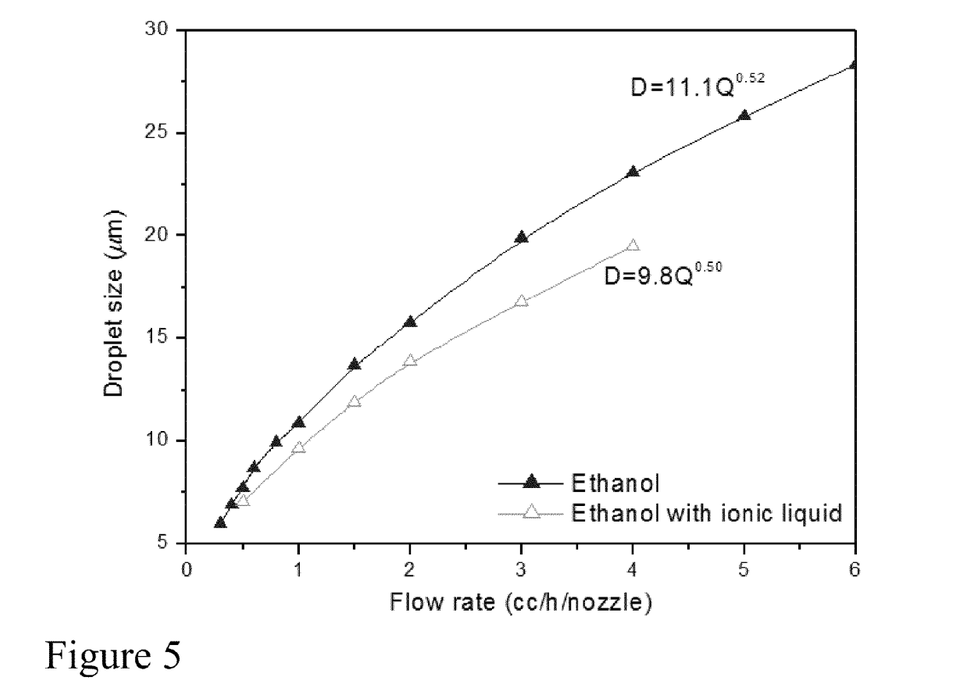

MES fabrication and testing details are documented elsewhere. Here we summarize briefly its main features. For the reference experiment the device has a 3-layer structure (FIG. 1a): a liquid distributor layer microfabricated in silicon, using deep reactive ion etching, with multiple nozzles (FIG. 1b) as ES sources held at high voltage $V_1$, an extractor electrode layer held at an intermediate voltage $V_2$, and an insulator/spacer layer sandwiched between the distributor and the extractor. FIG. 1c and FIG. 1d show the visualization of spray generated by two MES devices: a 91-nozzle chip with packing density of 253 sources/cm$^2$, and a 19-nozzle chip with a packing density of 11,000 sources/cm$^2$.

FIG. 2 depicts the setup for cooling experiments, with the components in FIGS. 1*a* and *b*, clearly identified. We use 4 Resistance Temperature Detector (RTD) elements as both temperature sensor and heater to mimic the Joule heating of a microelectronic chip or other devices requiring well-controlled thermal load. Each RTD measures 2×2×0.4-mm, has a thin, narrow, and meandering platinum resistance path sandwiched between two ceramic chips with high thermal conductivity. We record the voltage and current to compute heating power, resistance and temperature. The top surface of the RTDs is coated with a thin layer of graphite and then connected to the ground of the high voltage power supply. The bottom of the RTDs is thermally insulated. The distance between the extractor and the thermal test chip is nearly 5 mm. In this prototype, we use 19 or 37 nozzles with a packing density of 253 sources/cm$^2$ and with a footprint of 7.6 mm$^2$ and 14.8 mm$^2$ respectively. The sprays diverge and can cover the entire 16 mm$^2$ thermal test element. A liquid coolant such as ethanol is pumped at flow rates ranging between 25 cc/h and 100 cc/h through the MES device to deliver the charged droplets with typical mean diameter of 25 μm and a relative standard deviation of 10%, as measured by Phase Doppler Anemometry (PDA).

EXAMPLES

Reference Example 1

Droplet Impact on Heated Surface

The droplet impact dynamics is usually classified in terms of Weber number $We=\rho d v_0^2/\gamma$ and Ohnesorge number $Oh=\mu/(\rho\gamma d)^{1/2}$, where ρ is the liquid mass density, $v_0$ is the droplet impacting velocity, d is the droplet diameter before impact, γ is the liquid interfacial tension, and μ is the liquid dynamic viscosity, respectively. We is the ratio between the inertial and the surface tension forces, while Oh relates the viscous force to inertial and surface tension forces. For typical ES droplets impacting a grounded surface, We~O(10) and Oh~O(0.1), corresponding to a relatively gentle impact with droplet spreading, but without splashing. The critical parameter that has a significant effect is the surface temperature $T_s$. When $T_s$ is sufficiently larger than the fluid boiling point, a thin vapour layer forms between the bottom of the droplet and the substrate upon impact. This condition corresponds to the well-known Leidenfrost point. At this point, the contact angle is nearly 180°, and a microdroplet generally tends to experience rebound.

Once the droplets are electrically charged, if the impact time $\tau_{im}=8d/3v_0=8$ μs is less than the charge relaxation time $\tau_r=\in/K=16$ μs, where d is the droplet diameter, $v_0$ is the impact velocity, and ∈ is the dielectric permittivity of the liquid, the charge leakage from the droplet to the substrate is relatively slow. Since the droplet remains sufficiently charged even after impact, it experiences an additional Coulombic attraction force (image force) with the substrate. For picoliter droplets, the image force is as strong as 1000× of the gravity and may help prevent rebound. The high-speed image sequence shown in FIG. 3*a* confirms that the image force binds the droplet on the surface and hinders rebound. For the same surface temperature, on the other hand, we found that large droplets (~0.1 nL) do experience rebound, as shown in FIG. 3*b*. In this case, $t_{im}$ is much longer (~70 μs) and the charge transport from the droplet to the conducting surface is completed during contact. As a result, the image force plays no role in the post-impact developments.

It is also worth mentioning that even at substrate temperatures much lower than the Leidenfrost point when the droplet does not rebound, charged droplets exhibit smaller apparent contact angles as compared to neutral droplets because of the image force. Consequently, the charged droplets have larger surface-to-volume ratios and higher evaporation rates, which, in turn, translate into a higher heat flux extraction capability.

Reference Example 2

Typical Cooling Behavior

FIG. 4 shows a typical cooling curve, i.e. removed heat flux vs. surface temperature $T_s$, for an MES cooling system operated at a flow rate of 100 cc/h. The graph contains two regions. The first ($T_s$<55° C.) exhibits an approximately linear behavior with a slope smaller than the second region ($T_s$>55° C.), suggesting that the heat transfer mechanism is primarily single-phase convection, and the heat flux is too low to heat up the excess liquid to the boiling point ($T_b$). At the beginning of the second region ($T_s$>55° C.), the phase change becomes apparent, as evidenced by a steeper slope that is about twice that of the first region. As the superheat ($T_s-T_{room}$) increases, the slope of the curve gradually decreases. At 100° C., the curve reaches the upper limit of heat flux removed, i.e. the critical heat flux (CHF), of 96 W/cm$^2$. The general behavior of FIG. 4 is consistent with typical spray cooling except for the fact that the two phase region starts ~20K below $T_b$ in FIG. 4, while ordinarily the two-phase region starts 3 to 5K above $T_b$. The difference is because the size of the electrosprayed droplet is much smaller than the ~100 μm droplets generated by conventional atomizers. The small droplet diameter results in significantly shortened evaporation times that may be comparable to the droplet lifetime before contacting the substrate. Estimates of droplet evaporation time for different droplet diameter and ga temperature computed with a modified film model yielded a value of ~12 ms for a 100 μm diameter droplet typically generated by conventional atomizers at gas temperature of 70° C. This value is much longer than the ~1 ms droplet residence time, therefore evaporation can not be observed at this temperature. As the droplet diameter shrinks to 25 μm the evaporation time is reduced to merely ~2 ms with a gas temperature at 55° C., which is comparable to the droplet residence time, suggesting that the droplet experiences noticeable evaporation even before the boiling point is reached.

A parameter used to evaluate the cooling performance is the cooling efficiency, which is defined as the ratio of removed heat flux to the theoretic upper limit of the cooling capacity, i.e.:

$$\eta_e = \frac{\dot{q}}{\dot{m}_l h_{evap} + \dot{m}_l c_{p,l}(T_{evap} - T_{spray}) + \dot{m}_g c_{p,g}(T_{wall} - T_{spray})} \tag{1}$$

where $\eta_e$ is the cooling efficiency, $\dot{q}$ is the heat flux removed by the cooling device. The denominator of Equation (1) is the theoretical upper limit of the cooling capacity, i.e., the sum of the heat flux needed to raise the liquid temperature to boiling point, of the liquid latent heat, and of the enthalpy absorbed by the gas and vapor, where $\dot{m}_1$ is the liquid mass flow rate, $c_{p,1}$ is the liquid specific heat, $T_{evap}$ is the boiling point, $T_{spray}$ is the initial temperature of the spray, $h_{evap}$ is the fluid latent heat, $\dot{m}_g$ is the gas mass flow rate, and $c_{p,g}$ is the gas specific thermal capacity. The MES cooling is very efficient. At the CHF in FIG. 4, the system reaches a cooling efficiency of 60%, a value that could be further improved by using smaller droplet sizes, as discussed in the next example.

Reference Example 3

Effect of Droplet Diameter

At a constant flow rate, the droplet diameter can be fine tuned by changing the liquid conductivity K with trace amount of ionic liquid additives or other electric conductivity enhancers or by partitioning the flow rate through more electrospray sources, that is by increasing the multiplexing level. Here we implement the first, easier approach. FIG. 5 shows the relationship between droplet size and flow rate for two liquids with different conductivities: pure ethanol with conductivity K measured at $1.3 \times 10^{-5}$ S/m and ethanol doped with 1.6 PPM (by weight) of the ionic liquid, with conductivity $K=3.3 \times 10^{-5}$ S/m. For the same flow rate, the higher conductivity decreases the droplet size by about 20% and the droplet volume by about 60%.

Figure 6:
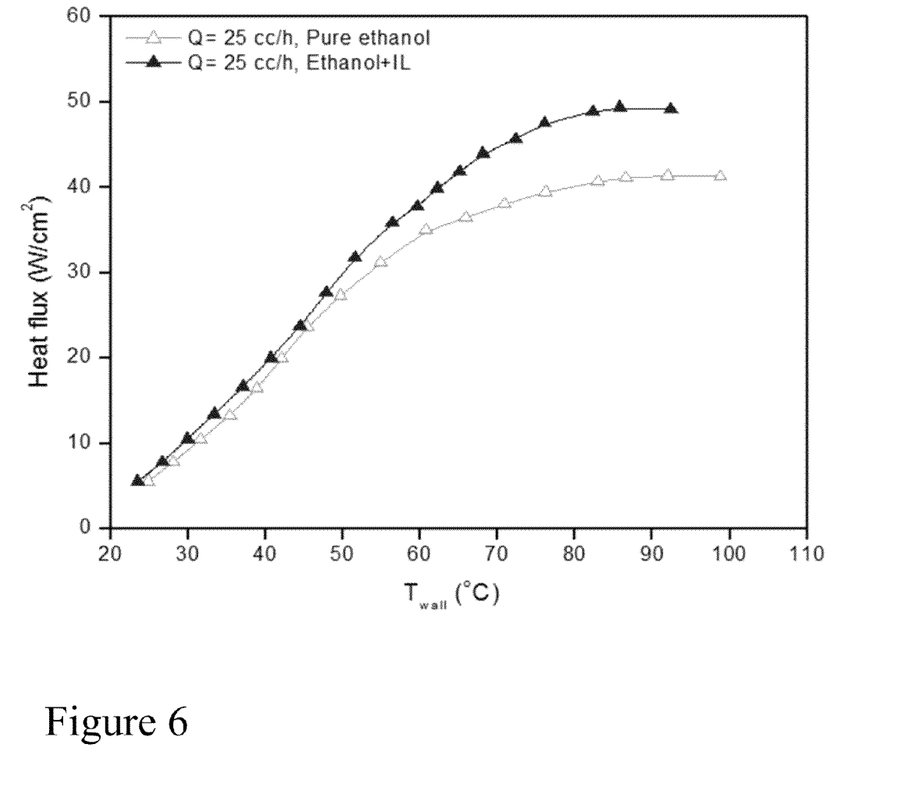

FIG. 6 shows the cooling curves for two multiplexed electrosprays with different droplet sizes that operated at an identical flow rate of 25 cc/h. The droplet size effect is twofold. First, the CHF is higher for smaller droplets. At Q=25 cc/h, the MES with smaller droplets reaches a CHF 24% higher than that with larger droplets. Second, at the identical heat flux, the substrate cooled by smaller droplets has a lower wall temperature. For example, with Q=25 cc/h and heat flux of 40 W/cm$^2$, the wall temperature is ~20K cooler with smaller droplets. This suggests smaller droplets lead to more effective cooling. Indeed, the effectiveness was increased from 82% to 97% at CHF by decreasing droplet size for the same flow rate of 25 cc/h.

Reference Example 4

Effect of Flow Rates

Figure 4:
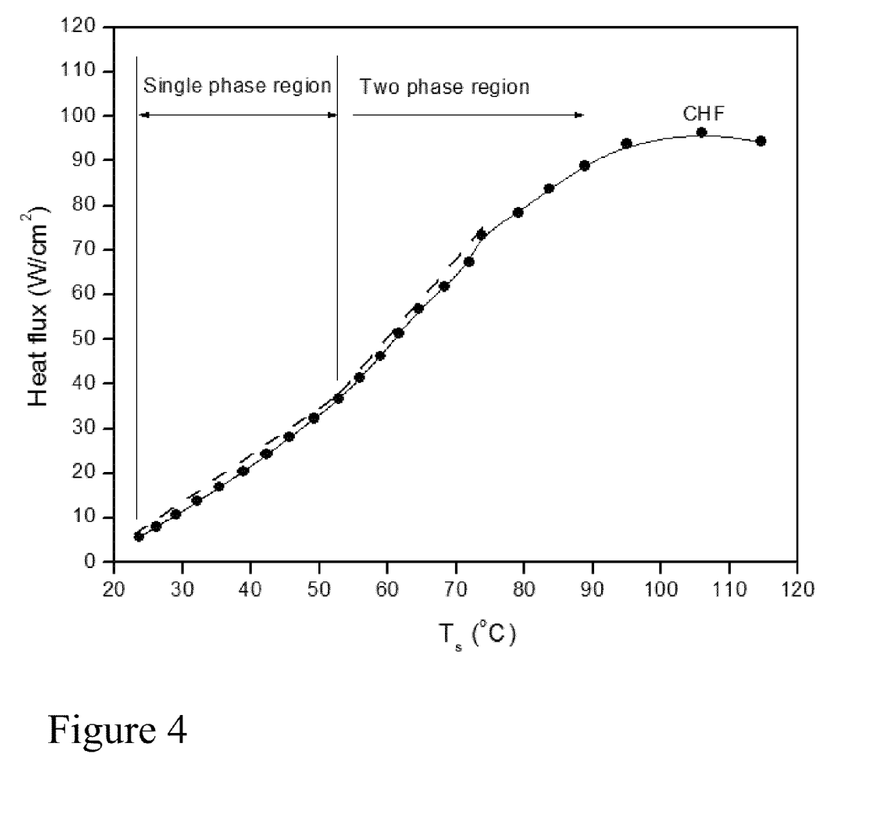
Figure 7:
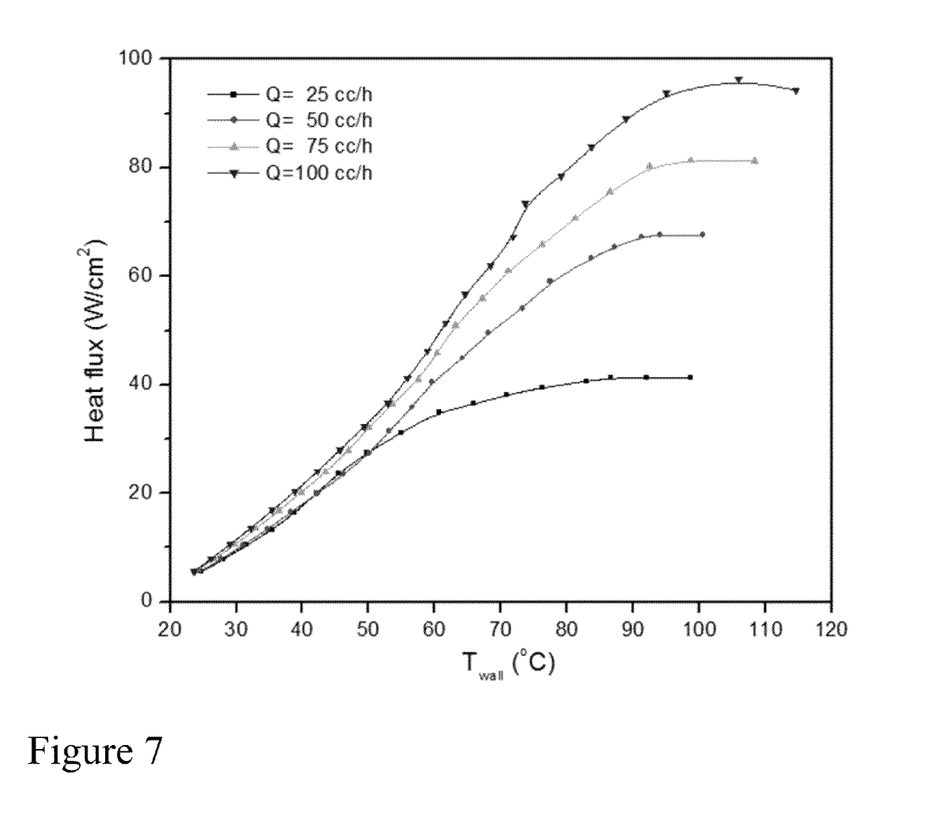
FIG. 7 depicts a graph with cooling curves showing heat extracted per unit area and time (heat flux) as a function of wall temperature for ethanol operated at flow rates ranging between 25 cc/h and 100 cc/h corresponding to different droplet sizes.

FIG. 7 shows four cooling curves for multiplexed electrosprays operated with pure ethanol at 25, 50, 75 and 100 cc/h. All curves show the double-slope behaviour as for the cooling curve in FIG. 4. As the flow rate increases from 25 to 100 cc/h, the CHF was increased from 40 to 96 W/cm$^2$. This is not surprising because a higher coolant flux is capable of removing more heat flux. Meanwhile, the temperature at which CHF is reached also increases, because as the flow rate increases, more superheat is needed to evaporate a given amount of liquid.

One disadvantage of higher flow rates is the declining cooling efficiency. The droplet size scaling law shown in FIG. 5 may help to explain this phenomenon. FIG. 5 clearly shows the droplet size has a monotonic dependence on the liquid flow rate, i.e., $d_{droplete} \approx Q^\alpha$, where $d_{droplete}$ is the droplet diameter, and a is the exponent of the power law and is approximately 0.5 for ethanol. The scaling law suggests that increasing flow rate from 25 cc/h to 100 cc/h will approximately double the droplet size. Larger droplets have longer contact time upon impact, thus more electric charge will be transferred to the substrate. As a result, less image force is applied and the droplet is more likely to rebound. The rebound droplets contribute to loss of cooling capacity, and eventually results in a decreased cooling efficiency.

High heat flux removal and high cooling efficiency can be achieved simultaneously if we maintain both large flow rates and small droplets, which can be realized by increasing the total number of nozzles and thus reducing the average flow rate delivered by each nozzle. Considering the restriction of the area of a given microelectronic chip, we need to increase the packing density of the ES sources to integrate more nozzles on per unit area, as demonstrated in FIG. 1d.

It can thus be seen that the present invention provides for significant advances over the prior art for spray cooling by relying on a multiplexing system for producing multiple monodispersed cone-jet electrosprays. The presence of electric charge on the microdroplets allows for a full exploitation of the droplet cooling capacity by avoiding the droplet rebound from the surface as a result of the electric image force. We demonstrated a prototype of a cooling system consists of microfabricated multiplexed electrospray to generate electrically charged microdroplets that removed a heat flux of 96 W/cm$^2$ with a cooling efficiency reaching 97%.

Further increases in cooling capabilities and efficiencies are possible with an increase in the number of electrospray sources per unit area, which is feasible with the spatial resolution of current microfabrication techniques. High cooling efficiency allows for the circulation of coolant at low flow rates, which directly contributes to a reduction in the overall system weight and energy use. The compactness and high efficiency of the MES device makes it potentially well suited for cooling of microelectronic chips or other devices requiring well-controlled thermal load in a broad range of applications.

It is also to be understood that the following claims are intended to cover all of the generic and specific features of the invention described herein and all statements of the scope of the invention which as a matter of language might fall therebetween.

What is claimed is:

1. A method of cooling a surface of a substrate, the method comprising the steps of: a) providing an electrosprayable cooling fluid to an atomizer array of substantially uniform atomizers, wherein the electrosprayable cooling fluid consists essentially of a liquid of finite electrical conductivity and optionally, an electrical conductivity enhancer; b) introducing and maintaining an electric field between the atomizer array and an extractor electrode, wherein each atomizer in the atomizer array produces at least one cone jet of the electrosprayable cooling fluid at an outlet of each atomizer when the electrical field is present; c) atomizing the electrosprayable cooling fluid in the atomizer array by partitioning the electrosprayable cooling fluid into multiple monodispersed cone-jet electrosprays that anchor to the outlet of each atomizer in the atomizer army; and d) introducing and maintaining an electric field between the extractor electrode and the surface of the substrate to be cooled or a conductive material in contact with the surface of the substrate to be cooled, wherein the surface of the substrate is cooled by charged droplets of electrosprayed cooling fluid impinging on the surface of the substrate to be cooled or a conductive material in contact with the surface of the substrate to be cooled; and wherein the electrosprayed cooling fluid evaporates from the surface of the substrate to be cooled or the conductive material in contact with the substrate to be cooled after impinging on the surface to be cooled or a conductive material in contact with the substrate to be cooled so that none of the electrosprayed cooling fluid remains on the surface of the substrate to be cooled or the conductive material in contact with the substrate to be cooled.

2. The method according to claim 1 wherein the liquid of finite electric conductivity comprises a material selected from the group consisting of water, liquid hydrocarbons, alcohols, fluorocarbon liquids, and combinations of one or more of the foregoing.

3. The method according to claim 2, wherein the cooling fluid comprises ethanol.

4. The method according to claim 1, wherein the electrical conductivity enhancer is present and comprises an ionic liquid.

5. The method according to claim 1, wherein the droplets of the electrosprayed cooling fluid do not rebound from the surface of the substrate to be cooled or the conductive material in contact with the substrate to be cooled.

6. The method according to claim 1, wherein the surface of the substrate to be cooled or the conductive material in contact with the substrate to be cooled is grounded.

7. The method according to claim 1, wherein the charged droplets of electrosprayed cooling fluid exhibit a cooling efficiency, defined as the ratio of removed heat flux to a theoretical upper limit of cooling capacity, of at least 60% after critical heat flux.

8. The method according to claim 7, wherein the charged droplets of electrosprayed cooling fluid exhibit a cooling efficiency of at least 82% after critical heat flux.

9. The method according to claim 8, wherein the charged droplets of electrosprayed cooling fluid exhibit a cooling efficiency of at least 97% after critical heat flux.

10. The method according to claim 1, wherein the cooling fluid consists essentially of ethanol.

11. The method according to claim 1, wherein the array of substantially uniform atomizers are spaced so that the array exhibits a packing density of at least about 253 atomizers/$cm^2$.

* * * * *